United States Patent [19]

Foss

[11] Patent Number: 5,844,916
[45] Date of Patent: Dec. 1, 1998

[54] BUILT IN ACCESS TIME COMPARATOR

[75] Inventor: Richard C. Foss, Scotland, Canada

[73] Assignee: Mosaid Technologies Incorporated, Kanata, Canada

[21] Appl. No.: 429,544

[22] Filed: Apr. 27, 1995

[51] Int. Cl.$^6$ .................................................. G06F 11/00
[52] U.S. Cl. ............................................................ 371/25.1
[58] Field of Search .......................... 371/25.1, 24, 21.2, 371/27

[56] References Cited

U.S. PATENT DOCUMENTS 5,619,513  4/1997  Shatter et al. ........................... 371/25.1
5,659,553  8/1997  Suzuki ................................... 371/25.1

*Primary Examiner*—Vincent P. Canney
*Attorney, Agent, or Firm*—Pascal & Associates

[57] ABSTRACT

A method of testing an integrated circuit chip comprised of applying to and storing a first test pattern of data on the chip, applying a second test pattern of data to the chip which corresponds to the first test pattern, comparing the stored test pattern with the second test pattern on the chip, and indicating a test fault on a test pad in the event at least one bit of the first and second test pattern differ from each other.

5 Claims, 2 Drawing Sheets

BUILT IN ACCESS TIME COMPARATOR

FIELD OF THE INVENTION

This invention relates to methods of testing integrated circuit memories.

BACKGROUND TO THE INVENTION

Testers of large memories must be able to apply wide word (e.g. 8 bits or more) test patterns to the memories and to read the memories to determine whether the memories have stored the test pattern data properly. Unfortunately most testers have been unable to test modern high speed, wide word memories properly. In order to test such memories, special calibrated channels are required to ensure data integrity as it moves into and out of the memory chip from and to the testers. Such calibrated channels are difficult and therefore expensive to set up and do not reflect the actual operating conditions of a memory chip.

SUMMARY OF THE INVENTION

The present invention solves the above problem by avoiding the use of calibrated channels. A test pattern is applied to a chip, and then the data on the chip is compared with expected data, on the chip itself. Each data bit follows the same path as in normal operation and drives the normal data output pins with appropriate test loads, replicating the critical timing path. The data comparator takes its input from the output pad itself, thereby testing the entire output path. A test pad on the chip provides a "good" or "faulty data" indication which can be monitored by a tester. The test pad provides the indication based on all of the bits of the test pattern; i.e. if a single bit is incorrect, a faulty data indication results. Thus a slow tester that need only respond to the test pad logic state can be used.

In accordance with an embodiment of the present invention, a method of testing an integrated circuit chip is comprised of applying to and storing a first test pattern of data on the chip, applying a second test pattern of data to the chip which corresponds to the first test pattern, comparing the stored test pattern with the second test pattern on the chip, and indicating a test fault on a test pad in the event at least one bit of the first and second test pattern differ from each other.

BRIEF INTRODUCTION TO THE DRAWINGS

A better understanding of the invention will be obtained by reading the description of the invention below, with reference to the following drawings, in which:

FIG. 1 is a block diagram of a chip under test in accordance with the present invention, FIGS. 2, 3 and 4 together illustrate a logic diagram of an embodiment of the invention.

DETAILED DESCRIPTION OF THE INVENTION

Figure 1:
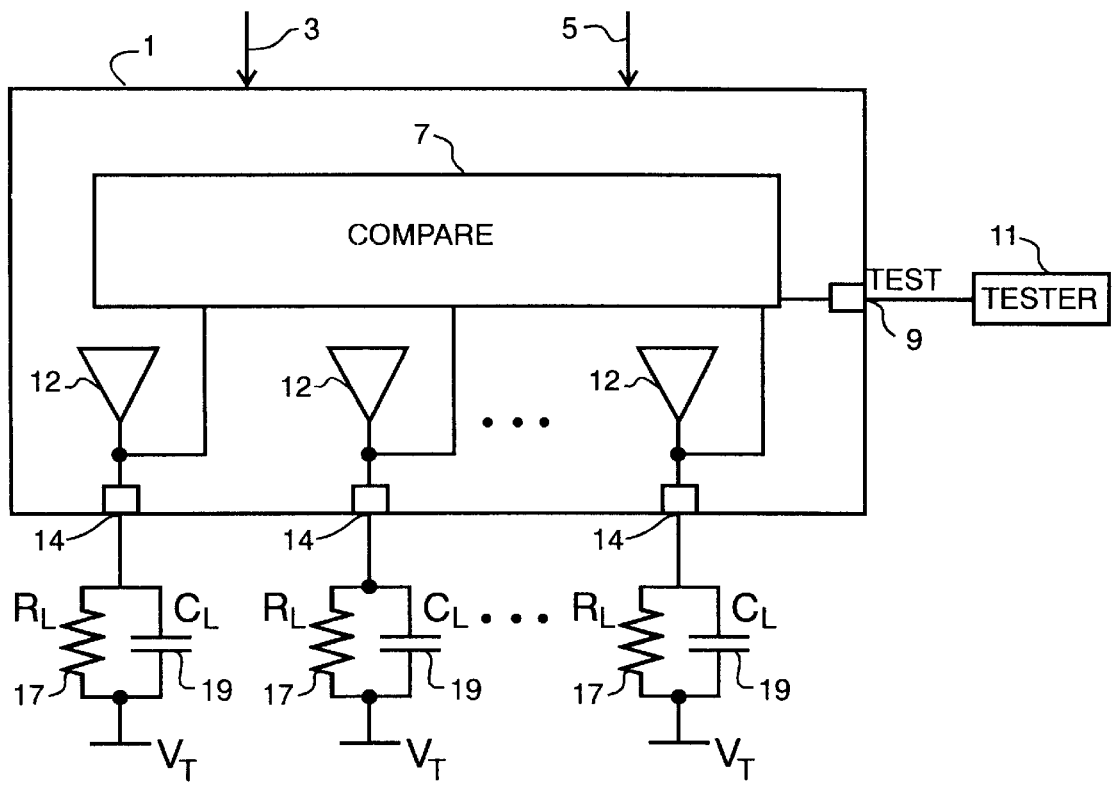

FIG. 1 illustrates a chip 1, such as a memory, which is to be tested. A first test pattern is applied to the chip using input lines 3, which data is stored in the chip in a well known manner. Subsequently, a second test pattern formed of expected data is applied to the chip using input lines 5. The expected data is latched into the chip using latches that may already exist in other functions, i.e. as a write-per-bit mask register. Input lines 3 and 5 can be combined as a single input, with different control signals moving the loading of normal data and expected data, i.e. bidirectional DQ pins where the falling edge of /CAS loads expected data, and the write command, either the falling edge of /CAS or /WE, latches normal data.

The actual data and the expected data are compared in an on-chip comparison circuit 7. The comparison circuit is coupled to a test pad 9, which achieves logic levels based on whether all of the bits of the first and second test patterns have matched or not. For example, the logic level of the test pad can be at high logic level if a non-matching bit has been found, and can remain at low logic level if all bits match.

The multibit data outputs 12 drive output pads 14. The on-chip comparison circuit 7 takes the levels present at the output pads 14 for comparison with expected data. The output pads can be loaded in test mode with a specified test load consisting of a resistor 17 and capacitor 19 (or any other active or passive load) terminated by a reference level $V_T$. In this way the comparator can measure the full critical timing path of each output.

A tester 11 can detect the logic level of the test pad. In this manner, the tester is not required to apply and receive test pattern data bits at real time operating speed of the memory, and can obtain an indication only of the result. All high speed, wide data word data is processed on-chip, and the actual testing, i.e. the comparison, is performed by the chip itself instead of by the relatively slower, off-chip tester. As a result, special calibrated channels to the tester used in the prior art are not needed.

Figure 2:
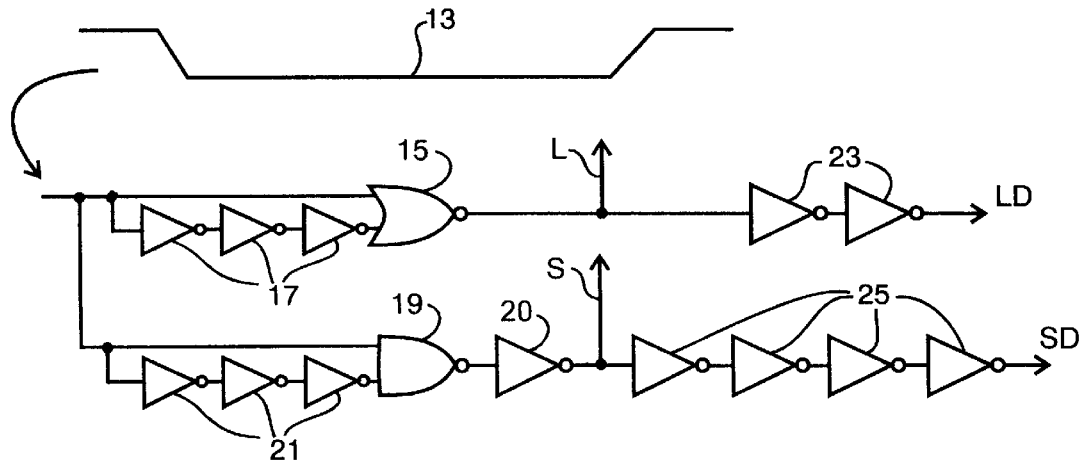
Figure 3:
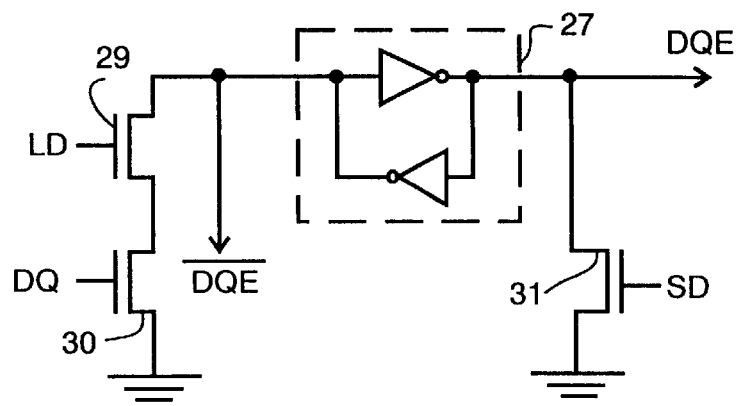
Figure 4:
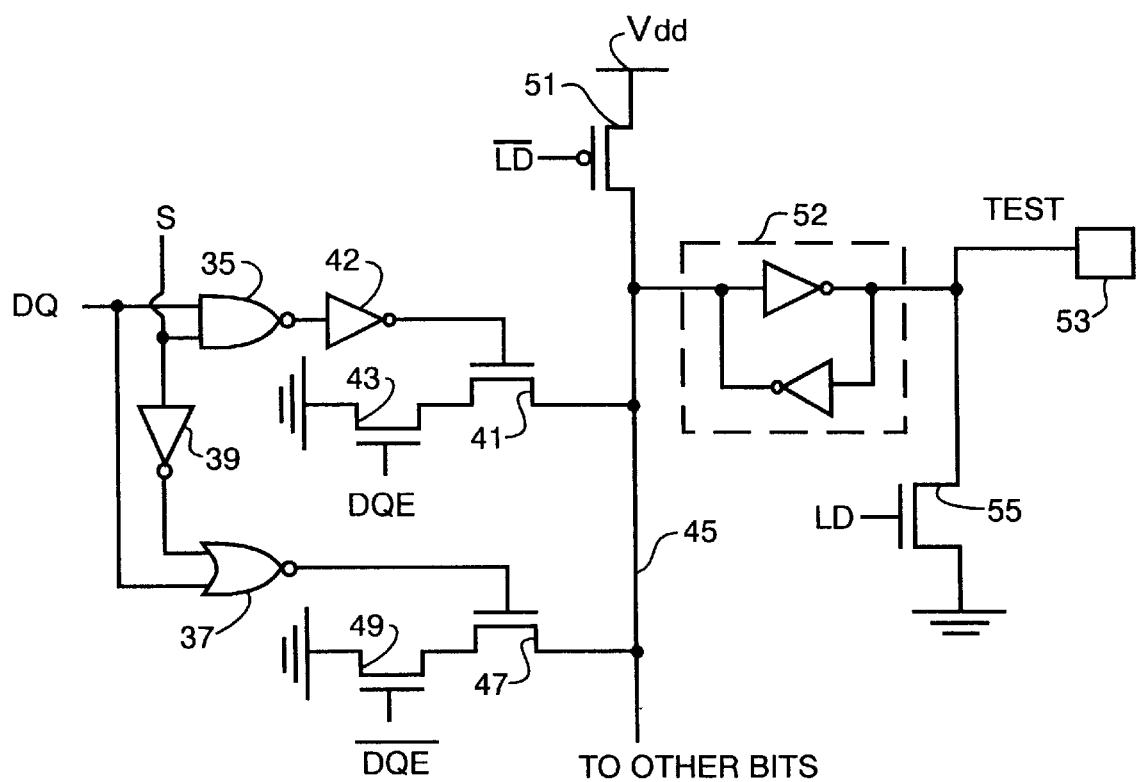

A circuit for implementing the above is shown in FIGS. 2, 3 and 4 taken together. With reference to FIG. 2, a test strobe input signal 13 is applied to a pulse generating circuit to generate a pulse L at an L output on the falling edge of the test strobe 13 and a pulse S at an S output on the rising edge of the test strobe 13. The pulse L can be generated by applying the test strobe 13 to one input of a NOR gate 15 and through a series of inverters 17 to the other input of NOR gate 15. The pulse S can be generated by applying the test strobe 13 to one input of NAND gate 19 and through a series of inverters to the other input of NAND gate 19 which passes the signal through inverter 20.

The L pulse is applied through an even number of inverters 23 to provide a delayed pulse LD, and the S pulse is applied through a larger even number of inverters 25 to provide a delayed pulse SD.

With reference to FIG. 3, an "expected data" latch 27, formed of a pair of crosscoupled inverters, is connected between the source-drain circuits of a pair of n-channel field effect transistors (FETs) 29, 30 connected in series to ground, and the source-drain circuit of an FET 31 connected to ground. The latch 27 can be a buffer on the chip, e.g. a write-per-bit mask register.

The LD lead is connected to the gate of FET 29 and the SD lead is connected to the gate of FET 31. A source of expected data, such as input DQ, is applied to the gate of FET 30.

After the completion of a preceding test mode operation, the SD pulse goes high, turning on n-channel device 31, to reset the expected data latch so that DQE=0 and DQE=1.

In operation, an expected data bit of the second test pattern is applied to the DQ input. Depending on the logic value of $DQ_i$, the latch 27 is either set or reset. FET 31 is non-conductive due to the low logic level of SD at this time.

The test strobe 13 is applied to the pulse generation circuitry of FIG. 2, and at its falling edge a pulse L is generated. Depending on the state of the DQ input during the pulse L interval, the junction of latch 27 and FET 29 is brought to low level, or left in its present state. In the initial state, DQE is low (and /DQE is high), latch 27 is initially set with the junction of latch 27 and FET 29 high. If the DQ input is high, n-channel transistor 30 will be enabled to change the state of the latch wherein DQE=1 and /DQE=0. If DQ is low the latch will remain unchanged.

In operation the inverse of the expected data is supplied to the DQ pin.

The logic levels of the DQE and /DQE leads are thus established, for application to the circuit of FIG. 4.

The DQ bit is applied to an input of NAND gate 35 (FIG. 4) and to an input of NOR gate 37. The S pulse signal is applied to the other input of gate 35 and through an inverter 39 to the other input of gate 37. The output of NAND gate 35 is connected to an inverter 42. The output of inverter 42 is connected to the gate of n-channel FET 41, which has its source-drain circuit connected in series with the source-drain circuit of a similar FET 43 between ground and a test bus 45.

The output of NOR gate 37 is connected to the gate of n-channel FET 47, which has its source-drain circuit connected in series with the source-drain circuit of similar FET 49 between ground and test bus 45. Test bus 45 is connected through the source-drain circuit of p-channel FET 51 to a voltage rail Vdd. Corresponding similar circuits for each bit of the test pattern are all connected to the test bus 45.

The test bus is connected via error latch 52 to a test pad 53. The test pad is connected through the source-drain circuit of n-channel FET 55 to ground. The LD signal is applied to the gate of FET 55.

When a test is to be performed, the rising edge of the S pulse is applied to the gate 35, and the inverse to gate 37. The state of the original DQ bit is sampled. The bus 45 is precharged to Vdd through FET 51 due to the /LD pulse, derived from LD, applied to the gate of FET 51.

If the DQ bit is high, the output of WAND gate 35 will be low and the gate of FET 41 will be high. If DQE is also high, FET 43 and FET 41 will conduct, bringing bus 45 to low (ground) logic level when the LD pulse occurs. This represents an error condition.

On the other hand, if DQ matches /DQE, the expected bit value, bus 45 remains at the precharged raised high logic level. This represents the no error condition.

In the inverse condition, with DQE and DQ at low logic level, both FET 47 and FET 49 conduct, bringing bus 45 to low logic level. This also represents an error condition. If /DQE, the expected bit logic level, is different from the initial DQ logic level, the bus 45 remains at high logic level.

When the bus is at high logic level, indicating a match, test latch 52 is set, and the test pad goes to low logic level (being pulled to ground through FET 55). When the bus goes to low logic level, test latch 52 is reset, raising the test pad to high logic level, indicating an error.

Since the failure of any /DQE bit to match a DQ bit for any word on the chip results in the test latch being pulled to high logic level, this can be detected on the single test pad 53 by the tester.

It should be noted that it is preferred that the inverse of the expected bit state, i.e. /DQE, should be strobed into the chip, rather than the expected bit state DQE, in order to ensure that the expected data is not "remembered" at the test pad, and that each buffer switches from false to true.

A single test strobe clock is used to strobe the inverse of the expected state into latch 27, which can be a chip data register, on the falling edge of the strobe clock. A comparator strobe function is then performed between actual DQ level and the inverted inverse data, on the rising edge of the strobe clock. If a match is found, then the test pad is pulled down to signal that the bit is correct both in respect of function and at the tested access time.

A person understanding this invention may now conceive of alternative structures and embodiments or variations of the above. All of those which fall within the scope of the claims appended hereto are considered to be part of the present invention.

I claim:

1. A method of testing an integrated circuit chip comprising:

(a) applying to and storing a first test pattern of data on the chip, (b) applying a second test pattern of data to the chip which corresponds to the first test pattern, (c) comparing the stored test pattern with the second test pattern on the chip, and (d) indicating a test fault on a test pad in the event at least one bit of the first and second test pattern differ from each other.

2. A method as defined in claim 1 in which the first test pattern is an inverse of the second test pattern.

3. A method as defined in claim 2 including strobing the first test pattern into the chip while addressing the chip, and applying the second test pattern at a later time.

4. A method as defined in claim 3 including storing the first test pattern in on-chip latches, and in which the comparing step includes exclusive OR-ing each bit of the second test pattern with a corresponding bit of the first test pattern, whereby an error latch connected to the test pad may be set.

5. A method as defined in claim 1 in which the normal data output pins are enabled while in test mode, and the signals at said normal data output pins are used in the comparison with expected data.

* * * * *